United States Patent
Miyanaga et al.

(10) Patent No.: US 10,101,008 B2
(45) Date of Patent: Oct. 16, 2018

(54) WAVELENGTH CONVERSION MEMBER, MOLDED BODY, WAVELENGTH CONVERSION APPARATUS, SHEET MEMBER, LIGHT EMITTING APPARATUS, LIGHT GUIDE APPARATUS AND DISPLAY APPARATUS

(71) Applicant: NS MATERIALS INC., Fukuoka (JP)

(72) Inventors: Akiharu Miyanaga, Fukuoka (JP); Eiichi Kanaumi, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 73 days.

(21) Appl. No.: 15/302,078

(22) PCT Filed: Apr. 3, 2015

(86) PCT No.: PCT/JP2015/060613
§ 371 (c)(1),
(2) Date: Oct. 5, 2016

(87) PCT Pub. No.: WO2015/156227
PCT Pub. Date: Oct. 15, 2015

(65) Prior Publication Data
US 2017/0122527 A1    May 4, 2017

(30) Foreign Application Priority Data
Apr. 8, 2014 (JP) ................... 2014-079563

(51) Int. Cl.
*F21V 9/30* (2018.01)
*G02F 1/1335* (2006.01)
(Continued)

(52) U.S. Cl.
CPC .............. *F21V 9/30* (2018.02); *G02B 6/0026* (2013.01); *G02B 6/0068* (2013.01);
(Continued)

(58) Field of Classification Search
CPC  F21V 9/30; F21V 9/16; G02B 6/0026; G02B 6/0068; G02B 6/0073; H01L 33/50
(Continued)

(56) References Cited

U.S. PATENT DOCUMENTS

2010/0044731 A1  2/2010 Tokunaga et al.
2010/0193806 A1  8/2010 Byun
(Continued)

FOREIGN PATENT DOCUMENTS

JP  2007-157798  6/2007
JP  2008-130279  6/2008
(Continued)

OTHER PUBLICATIONS

International Search Report, along with English-language translation thereof, in Appl. No. PCT/JP2015/060613, dated Jun. 30, 2015.

*Primary Examiner* — Laura Tso
(74) *Attorney, Agent, or Firm* — Greenblum & Bernstein, P.L.C.

(57) ABSTRACT

To provide a wavelength conversion member, molded body, wavelength conversion apparatus, sheet member, light emitting apparatus, light guide apparatus and display apparatus particularly capable of suppressing the black discoloration occurrence of a resin layer positioned immediately above a light emitting device as compared with conventional techniques, the present invention provides an LED apparatus having a storage portion, an LED chip disposed inside the storage portion, and a resin layer filled inside the storage portion, the resin layer is comprised by having a first resin layer on the side close to an LED device, and a second resin layer on the side far from the LED device, a light scattering agent is included in at least the first resin layer, and quantum dots are not included in the first resin layer and are included in the second resin layer.

13 Claims, 13 Drawing Sheets

(51) Int. Cl.
*F21V 8/00* (2006.01)
*H01L 33/50* (2010.01)

(52) U.S. Cl.
CPC ..... *G02B 6/0073* (2013.01); *G02F 1/133603* (2013.01); *H01L 33/50* (2013.01); *H01L 33/502* (2013.01); *G02F 2001/133614* (2013.01); *H01L 33/505* (2013.01); *H01L 33/507* (2013.01); *H01L 2224/48091* (2013.01); *H01L 2924/181* (2013.01); *H01L 2933/0091* (2013.01)

(58) Field of Classification Search
USPC .................................................. 362/608, 612
See application file for complete search history.

(56) References Cited

U.S. PATENT DOCUMENTS

| | | |
|---|---|---|
| 2012/0087105 A1 | 4/2012 | Dai et al. |
| 2012/0113672 A1 | 5/2012 | Dubrow et al. |
| 2014/0021503 A1 | 1/2014 | Yoshida et al. |
| 2014/0246689 A1* | 9/2014 | Luo ........................ H01L 33/504 257/98 |
| 2015/0085529 A1* | 3/2015 | Ko ........................ H05B 33/12 362/612 |
| 2016/0072026 A1 | 3/2016 | Kanaumi |
| 2016/0186960 A1* | 6/2016 | Kim .................. G02F 1/133514 349/71 |

FOREIGN PATENT DOCUMENTS

| | | |
|---|---|---|
| JP | 2008-198997 | 8/2008 |
| JP | 2010-177656 | 8/2010 |
| JP | 2011-71404 | 4/2011 |
| JP | 2012-204609 | 10/2012 |
| JP | 2014-56896 | 3/2014 |
| WO | 2012/132232 | 10/2012 |
| WO | 2014/041861 | 3/2014 |

* cited by examiner

WAVELENGTH CONVERSION MEMBER, MOLDED BODY, WAVELENGTH CONVERSION APPARATUS, SHEET MEMBER, LIGHT EMITTING APPARATUS, LIGHT GUIDE APPARATUS AND DISPLAY APPARATUS

TECHNICAL FIELD

The present invention relates to a wavelength conversion member, molded body, wavelength conversion apparatus, sheet member, light emitting apparatus, light guide apparatus and display apparatus having quantum dots.

BACKGROUND ART

A quantum dot is a nanoparticle having a particle diameter of about several nanometers to several tens of nanometers comprised of about several hundred to thousand semiconductor atoms, and forms a quantum well structure. The quantum dot is also called the nanocrystal.

For the quantum dot, it is possible to modify a peak emission wavelength in various manners, corresponding to the particle diameter and composition of the crystal. For example, as in Patent Documents 1 and 2, a light emitting apparatus is known where a fluorescent layer including quantum dots is arranged around an LED chip.

PRIOR ART DOCUMENT

Patent Document

[Patent Document 1]
Japanese Unexamined Patent Publication No. 2008-130279
[Patent Document 2]
Japanese Unexamined Patent Publication No. 2012-204609

DISCLOSURE OF INVENTION

Problems to be Solved by the Invention

FIG. 15 is a schematic diagram of an LED apparatus (light emitting apparatus) in conventional techniques. An LED apparatus 1 shown in FIG. 15 is provided with a storage portion 2, an LED chip 3 disposed inside the storage portion 2, and a resin layer 4 filled inside the storage portion 2. The resin layer 4 includes many quantum dots 5.

The resin layer 4 shown in FIG. 15 is a fluorescent layer, and light emitted from the LED chip 3 is subjected to emission wavelength conversion in the fluorescent layer 4, and is released from a light emitting surface 1a to the outside.

However, in the conventional LED apparatus 1 shown in FIG. 15, it has been found that black discoloration occurs in the fluorescent layer 4 including quantum dots 5 in a position A immediately above the LED chip 3 by emission of the LED chip 3, and that luminous efficiency of the LED apparatus 1 deteriorates.

The present invention was made in view of such a respect, and it is an object of the invention to provide a wavelength conversion member, molded body, wavelength conversion apparatus, sheet member, light emitting apparatus, light guide apparatus and display apparatus particularly capable of suppressing the black discoloration occurrence of a resin layer positioned immediately above a light emitting device as compared with conventional techniques.

Means for Solving the Problem

The present invention provides a wavelength conversion member having quantum dots, and is characterized in that the wavelength conversion member is comprised by having a first layer disposed on the side close to a light emitting device or on a light input surface side, and a second layer disposed on the side far from the light emitting device or on a light output surface side, a light scattering agent is included in at least the first layer, and that the quantum dots are not included in the first resin layer, and are included in the second layer.

In the invention, the light scattering agent is preferably included in an amount of from 0.2 volume % to 20 volume % in the first layer.

In the invention, as a substitute for the light scattering agent, or as well as the light scattering agent, a fluorescent substance may be added.

Further, the invention provides a wavelength conversion member having quantum dots, and is characterized in that the wavelength conversion member is made by including a light scattering agent and quantum dots in a resin, and that the light scattering agent is included in a range of 2.5 mass % to 10 mass % with respect to the resin.

Furthermore, the invention is characterized in that the wavelength conversion member as described in one of above-mentioned items is formed of a molded body.

Still furthermore, a wavelength conversion apparatus in the invention is characterized by being comprised by having a container provided with storage space, the wavelength conversion member as described in one of above-mentioned items or the molded body as described above disposed inside the storage space.

Moreover, a sheet member in the invention is characterized by being made by forming the wavelength conversion member as described in one of above-mentioned items in the shape of a sheet.

Further, a light emitting apparatus in the invention is characterized by having the wavelength conversion member as described in one of above-mentioned items, and a light emitting device, where the wavelength conversion member constitutes a resin layer covering a light emitting side of the light emitting device, the first layer constitutes a second resin layer on the side close to the light emitting device, and the second layer constitutes a second resin layer on the side far from the light emitting device.

Furthermore, in the invention, it is possible to make a configuration that the light emitting device is disposed inside a storage portion, and that the resin layer is filled inside the storage portion.

Still furthermore, a light guide apparatus in the invention is characterized by being comprised by having the wavelength conversion member as described in one of above-mentioned items, the wavelength conversion apparatus as described above, the sheet member as described above, or the light emitting apparatus as described in one of above-mentioned items, and a light guide plate.

Moreover, the light guide apparatus in the invention is characterized in that a plurality of light emitting apparatuses as described in one of above-mentioned items is disposed opposite a surface constituting a light guide plate.

Further, a display apparatus in the invention is characterized by having a display section, and the wavelength conversion member as described in one of above-mentioned items, the wavelength conversion apparatus as described above, the sheet member as described above, or the light emitting apparatus as described in one of above-mentioned items disposed on the back side of the display section.

Advantageous Effect of the Invention

According to the present invention, it is possible to effectively suppress the black discoloration occurrence and improve luminous efficiency as compared with conventional apparatuses, by making a configuration where a light scattering agent is added to the first layer on the side close to the light emitting device or on the light input surface side without adding quantum dots, and quantum dots are added to the second layer on the side far from the light emitting device, or on the light output surface side.

BEST MODE FOR CARRYING OUT THE INVENTION

Figure 15:
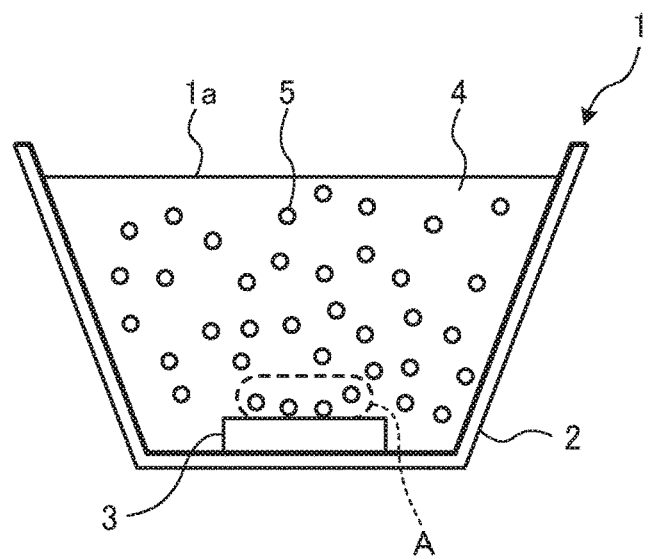
FIG. 15 is a schematic diagram of a conventional LED apparatus (light emitting apparatus)
Figure 16:
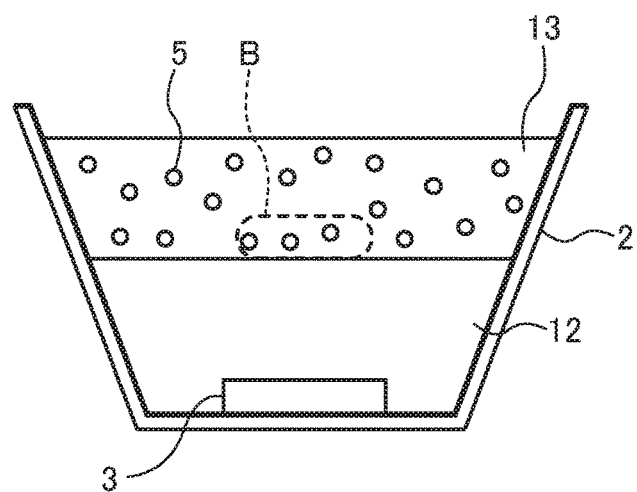
FIG. 16 is a schematic diagram of an LED apparatus (light emitting apparatus) for black discoloration occurrence examination provided with structure a part of which is different from that in FIG. 15.

The inventors of the present invention examined the occurrence of black discoloration also for a light emitting apparatus with structure shown in FIG. 16, as well as a conventional light emitting apparatus shown in FIG. 15. FIG. 16 is a schematic diagram of the LED apparatus (light emitting apparatus) for black discoloration occurrence examination provided with structure a part of which is different from that in FIG. 15. In FIG. 16, the same reference numerals as in FIG. 15 represent the same members as in FIG. 15.

In the LED apparatus shown in FIG. 16, a resin layer is comprised of a first resin layer 12 with which a surface of an LED chip 3 is coated, and a second resin layer 13 with which a surface of the first resin layer 12 is coated.

In the light emitting apparatus shown in FIG. 16, quantum dots 5 are not included in the first resin layer 12, and are included in only the second resin layer 13.

In the LED apparatus with the structure shown in FIG. 16, it has been found that black discoloration occurs in the vicinity B of the boundary between the first resin layer 12 and the second resin layer 13 in a direction immediately above the LED chip 3 by light emission of the LED chip 3.

Thus, from results of the black discoloration occurrence shown in FIGS. 15 and 16, it has been found that black discoloration occurs inside the resin layer including the quantum dot 5 immediately above the LED chip 3. The reason is considered that strong light is locally applied to the resin layer immediately above the LED chip 3, the resin layer including the quantum dot 5 in the position immediately above is acted upon by light, or light and heat, and that as a result, black discoloration occurs only immediately above the LED chip 3.

Therefore, in order to suppress the black discoloration occurrence, the inventors of the present invention arrived at the invention of a configuration that a light scattering agent is added to a first layer (first resin layer) on the side close to the light emitting device or on the light input surface side without adding quantum dots, and that quantum dots are added to a second layer (second resin layer) on the side far from the light emitting device or on the light output surface side.

By this means, light emitted from the light emitting device is scattered inside the first layer and enters the second layer including quantum dots. Therefore, as compared with the structure where strong light is locally applied to a wavelength conversion member (resin layer) comprised of a resin layer and the like as in conventional techniques, in this Embodiment, it is possible to cause the light to enter the second layer from the entire region of the interface between the first layer and the second layer. From the foregoing, in this Embodiment, as compared with conventional techniques, it is possible to effectively suppress the black discoloration occurrence of the wavelength conversion member and to improve luminous efficiency.

Figure 1A:
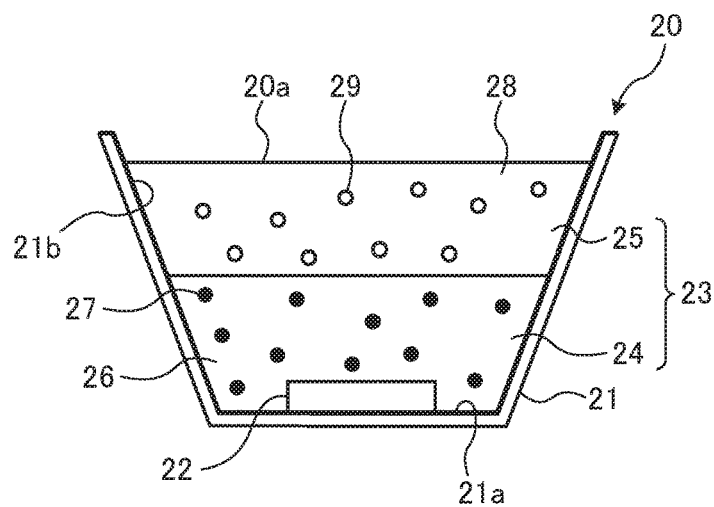
FIGS. 1A, 1B and 1C are schematic diagrams of an LED apparatus (light emitting apparatus)

Embodiments of the present invention will specifically be described below. As shown in FIG. 1A, an LED apparatus (light emitting apparatus) 20 in this Embodiment has a storage case 21 having a bottom 21a and side walls 21b surrounding the circumference of the bottom 21a, an LED chip (light emitting device) 22 disposed on the bottom 21a of the storage case 21, and a resin layer (wavelength conversion member) 23 filled inside the storage case 21 to seal the upper surface side (light emitting side) of the LED chip 22 to be comprised thereof. Herein, the upper surface side is a direction in which light emitted from the LED chip 22 is released from the storage case 21, and indicates a direction opposite to the bottom 21a with respect to the LED chip 22.

The LED chip 22 is disposed on a base wiring board not shown, and the base wiring board may constitute a bottom portion of the storage case 21. As the base board, for example, it is possible to present a configuration where a wiring pattern is formed on a substrate of glass epoxy resin or the like.

The LED chip 22 is a semiconductor device that emits light in applying the voltage in the forward direction, and is provided with a basic configuration where a P-type semiconductor layer and N-type semiconductor layer are subjected to PN junction. Alternatively, as a substitute for the LED chip 22, it is also possible to use a semiconductor laser and light emitting device such as an EL (Electro-Luminescence) device.

As shown in FIG. 1A, the resin layer 23 has a first resin layer (first layer) 24 with which the upper surface of the LED chip 22 is coated, and a second resin layer (second layer) 25 with which the surface of the first resin layer 24 is coated to be comprised thereof.

As shown in FIG. 1A, the first resin layer 24 is made by dispersing a plurality of light scattering agents 27 in a resin 26. Further, the second resin layer 25 is made by dispersing a plurality of quantum dots 29 in a resin 28. The resins 26, 28 relatively constituting the first resin layer 24 and second resin layer 25 are not limited particularly, and it is possible to use polypropylene, polyethylene, polystyrene, AS resin, ABS resin, methacrylate resin, polyvinyl chloride, polyacetal, polyamide, polycarbonate, modified-polyphenylene ether, polybutylene terephthalate, polyethylene terrain terephthalate, polysulfone, polyether sulfone, polyphenylene sulfide, polyamide imide, polymethyl pentene, liquid crystal polymer, epoxy resin, phenol resin, urea resin, melamine resin, epoxy resin, diallyl phthalate resin, unsaturated polyester resin, polyimide, polyurethane, silicone resin, mixtures thereof and the like.

The resin 26 used for the first resin layer 24 and the resin 28 used for the second resin layer 25 may be made of the same material or different materials. When the resins 26, 28 are made different from each other, for example, a resin with high thermal conductivity is disposed in the first resin layer 24, and the resin 28 that enables dispersion characteristics of the quantum dot 29 to be improved is selected for the second resin layer 25. As one example, a silicone resin is used for the first resin layer 24, and an epoxy resin is used for the second resin layer 25. Further, when the same resin is used, it is possible to use an epoxy resin, silicone resin and the like for both the first resin layer 24 and the second resin layer 25.

The light scattering agent 27 is particularly not limited in materials, and it is possible to present fine particles of silica ($SiO_2$), BN, AlN and the like.

For example, by using materials such as AlN and BN with high thermal conductivity as the light scattering agent 27, it is possible to improve the effect of suppressing the black discoloration occurrence. This is because it is considered that the black discoloration is affected by not only light but also heat.

Figure 3:
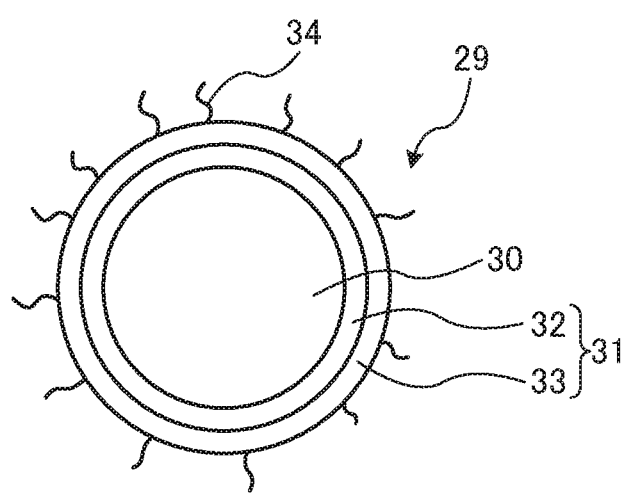
FIG. 3 is a schematic diagram illustrating one example of a quantum dot.

As shown in FIG. 3, for example, the quantum dot 29 in the present invention has a core portion 30 of a semiconductor particle, and a shell portion 31 with which the circumference of the core portion 30 is coated. For example, CdSe is used for the core portion 30, but materials are not limited particularly. For example, it is possible to use a core material including at least Zn and Cd, core material including Zn, Cd, Se and S, ZnCuInS, CdS, ZnSe, ZnS, CdSe, InP, CdTe, mixtures of some thereof, and the like.

The shell portion 31 protects the core portion 30 as a fluorescent portion. As shown in FIG. 3, the shell portion 31 is comprised of two-layer structure, and in other words, is preferably of the so-called multi-shell structure having a first shell portion (shell I) 32 with which the surface of the core portion 30 is coated, and a second shell portion (shell II) 33 with which the surface of the first shell portion 32 is coated.

For example, a band gap of the second shell portion 33 is made larger than a band gap of the first shell portion 32, but the invention is not limited thereto.

As shown in FIG. 3, many organic ligands 34 coordinate to the surface (surface of the second shell portion 33) of the quantum dot 29. By this means, it is possible to suppress coagulation of quantum dots 29, and it is possible to improve dispersion characteristics of the quantum dots 29 inside the resin 28. Materials of the ligands are not limited particularly, and examples thereof are octadecene, octadecane, trioctylphosphine (TOP), trialkyl phosphine oxide, alkylamine, dialkylamine, trialkylamine, alkylphosphonic acid and the like.

In addition, in the above-mentioned description, the shell portion 31 is of two-layer structure, and is also capable of being formed of three or more layers, or of one-layer structure. In such a case, it is suitable that the shell portion 31 is comprised of one layer of the second shell portion 33. In addition, in this Embodiment, it is possible to provide a one-layer structure controlled so that the composition ratio inside the shell portion gradually changes with distance from the core portion 30, and the like.

Alternatively, the quantum dot 29 may be comprised of only the core portion 30 of the semiconductor particle, without the shell portion 31 being formed. In other words, as long as the quantum dot 29 is provided with at least the core portion 30, the quantum dot 29 does not need to be provided with a coating structure by the shell portion. For example, when the core portion is coated with the shell portion, there is a case where the region as the coating structure is small or coating portion is too thin, and it is not possible to analyze and confirm the coating structure. Accordingly, irrespective of the presence or absence of the shell portion by analysis, it is possible to judge as the quantum dot 29.

As shown in FIG. 1A, the light scattering agent 27 is added to the first resin layer 24, and the quantum dot 29 is not included.

Therefore, the light emitted from the LED chip 22 is guided to the second resin layer 25, while scattering inside the first resin layer 24, and it is possible to suitably suppress the black discoloration occurrence in the position A immediately above the LED chip as described in the conventional example of FIG. 15. Further, in this Embodiment, by forming at least the inner surface of the side wall 21b of the storage case (storage portion) 21 shown in FIG. 1A as a light reflecting surface, it is possible to suitably guide the light scattered inside the first resin layer 24 to the second resin layer 25. At this point, in FIG. 1A, the side wall 21b is in an inclined shape such that the horizontal dimension is gradually widened with distance upward from the bottom 21a, and it is thereby possible to suitably guide the light reflected by the side wall 21b of the storage case 21 to the second resin layer 25.

In this Embodiment, when the light is guided from the boundary between the first resin layer 24 and the second resin layer 25 to the second resin layer 25, since the light scattered in the first resin layer 24 enters the second resin layer 25, as distinct from conventional techniques, it is possible to suppress the fact that strong light locally enters the boundary port ion between the first resin layer 24 and the second resin layer 25 positioned immediately above the LED chip 22. Accordingly, it is possible to appropriately suppress the fact that black discoloration occurs in the vicinity B of the boundary between the first resin layer and the second resin layer immediately above the LED chip as shown in FIG. 16.

In this Embodiment, the light guided to the second resin layer 25 is subjected to wavelength conversion by the quantum dot 29, and light of a predetermined color is released from the light emitting surface 20a to the outside.

The light scattering agent 27 included in the first resin layer 24 is preferably in an amount of from about 0.2 volume % to 20 volume %. Further, the light scattering agent 27 included in the first resin layer 24 is preferably in an amount of from 1 weight % to 45 weight %. When the additive amount is lower than 0.2 volume % or 1 weight %, the light scattering effect is not properly exhibited, and it is not possible to suitably suppress the black discoloration occurrence. Further, when the additive amount is higher than 20 volume % or 45 weight %, transmittance of the light in the first resin layer 24 decreases, and reduction in luminous efficiency tends to occur. Furthermore, the particle diameter of the light scattering agent 27 is preferably in a range of 0.2 μm to 100 μm.

Figure 1B:
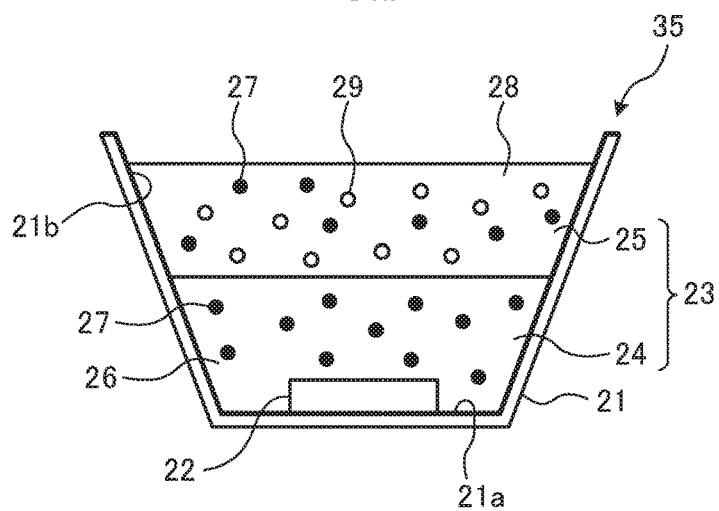

In addition to the configuration of FIG. 1A, an LED apparatus (light emitting apparatus) 35 shown in FIG. 1B has a configuration where the light scattering agent 27 is also added to the second resin layer 25. By this means, it is possible to promote scattering of light also inside the second resin layer 25, and improvements in luminous efficiency are expected. In the configuration of FIG. 1B, it is possible to make the additive amount of the light scattering agent 27 included in the second resin layer 25 smaller than the additive amount of the light scattering agent 27 included in the first resin layer 24.

By adding the light scattering agent 27 such as AlN and BN with high thermal conductivity to the second resin layer 25, it is possible to improve the effect of suppressing the black discoloration occurrence. This is because it is considered that the black discoloration is affected by not only light but also heat.

Further, the light scattering agents 27 may precipitate, as well as the form of being dispersed uniformly inside the resin. The light scattering agents 27 precipitated inside the first resin layer 24 may be in a state of being coagulated in the vicinity of the surface of the LED chip 3.

In addition, in the configurations of FIGS. 15 and 16, even when the light scattering agent is added to the resin layer (resin layer 4 in FIG. 15, second resin layer 13 in FIG. 16) including quantum dots 5, it is not possible to suitably suppress the black discoloration occurrence. As in this Embodiment, the light from the LED chip 22 is first scattered by the first resin layer 24 with the light scattering agent 27 added without including quantum dots, the scattered light is guided to the second resin layer 25 including the quantum dot 29, and it is thereby made possible to suitably suppress the black discoloration occurrence.

The resin layer 23 as shown in FIGS. 1A and 1B is made the two-layer structure of the first resin layer 24 and second resin layer 25, and may be three layers or more. At this point, it is possible to provide another resin layer between the first resin layer 24 and the LED chip 22, between the first resin layer 24 and the second resin layer 25, and the like. Furthermore, another resin layer may be formed on the second resin layer 25.

In the present invention, the resin may include the quantum dot and another fluorescent substance as a fluorescent pigment, fluorescent dye or the like different from the quantum dot. For example, there are quantum dots of red light emission and fluorescent substance of green light emission, or quantum dots of green light emission and fluorescent substance of red light emission. Among the fluorescent substances are a YAG (yttrium•aluminum •garnet) series, TAG (terbium•aluminum•garnet) series, sialon series, BOS (barium•orthosilicate) series and the like, but materials are not limited particularly. It is possible to apply such forms to forms other than the form of FIG. 1A, 1B or 1C as appropriate.

At this point, such a form may be made where the fluorescent substance is included as a substitute for the light scattering agent, or is included together with the light scattering agent.

For example, a fluorescent substance of green is added to the first resin layer 24, and the quantum dot 29 of red is added to the second resin layer 25. By this means, the light is diffused by the fluorescent substance of green, and the diffused light is input by the quantum dot 29. By this means, it is possible to release white light with uniform intensity from the entire region of the light emitting surface 20a. It is possible to modify combinations of colors in various manners.

Figure 1C:
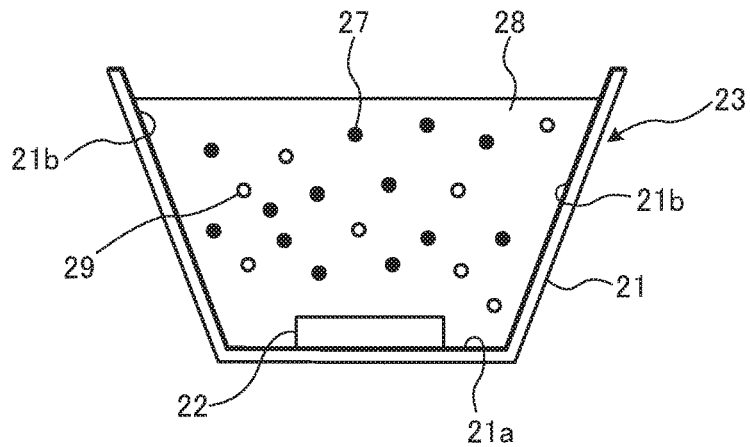

In FIG. 1C, the resin layer 23 is of one-layer structure, and the light scattering agent 27 and quantum dot 29 are included in the resin 28. Then, the light scattering agent 27 is included in an amount of from 2.5 mass % to 10 mass % with respect to the resin 28. Further, the quantum dot 29 is included in an amount of about a few mass % with respect to the resin 28. By this means, it is possible to suitably suppress the black discoloration occurrence, and as shown in experiments described later, it is possible to obtain excellent white light emission and to obtain high illuminance. In addition, it is possible to apply the configuration shown in FIG. 10 also to the second resin layer 25 in FIG. 1B.

Figure 2:
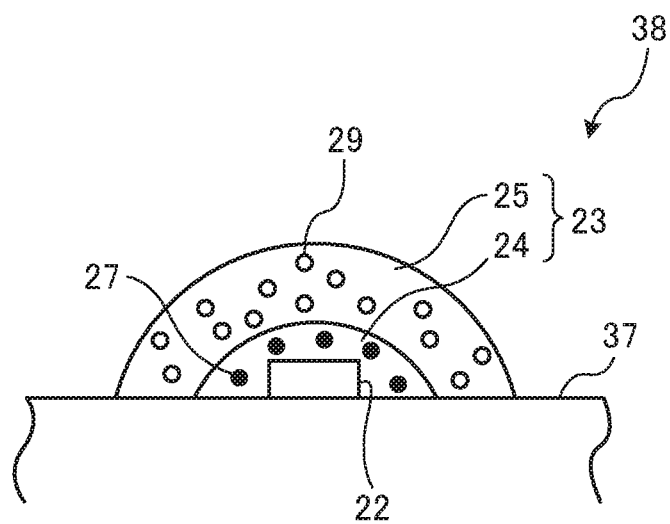
FIG. 2 is a schematic diagram of another LED apparatus (light emitting apparatus)

FIG. 2 is a schematic diagram of another LED apparatus (light emitting apparatus). In an LED apparatus (light emitting apparatus) 38 shown in FIG. 2, the LED chip (light emitting device) 22 is installed on a substrate 37, and the first resin layer (first layer) 24 is formed over the upper surface of the LED chip 22 and the upper surface of the substrate 37. Further, the upper surface of the first resin layer 24 is coated with the second resin layer (second layer) 25. The first resin layer 24 includes the light scattering agent 27, but does not include the quantum dot 29. On the other hand, the second resin layer 25 includes the quantum dot 29. As in FIG. 1B, the second resin layer 25 may include the light scattering agent 27.

In the LED apparatus (light emitting apparatus) 38 shown in FIG. 2, as distinct from FIGS. 1A and 1B, without providing the case-shaped storage portion to store the LED chip 22 and resin layer 23, the resin layer (wavelength conversion member) 23 is formed on the LED chip 22 installed on the substrate 37 by potting processing and the like.

In FIG. 2, the surface of the resin layer 23 is in the shape of a dome. For example, a dent portion may be formed on the surface, the shape may be rectangular, and thus, the shape is not limited particularly.

Figure 4A:
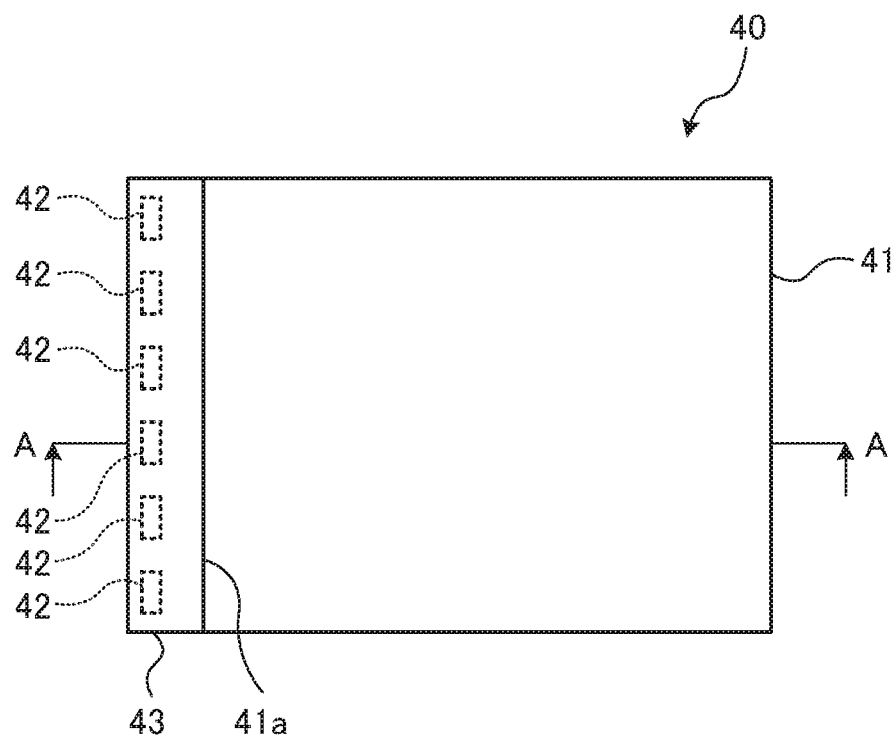
FIGS. 4A and 4B are schematic diagrams of a light guide apparatus using LED apparatuses (light emitting apparatuses)
Figure 4B:
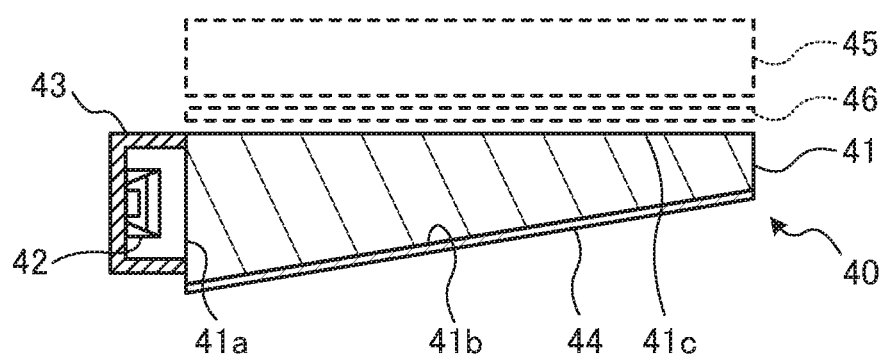

FIGS. 4A and 4B are schematic diagrams of a light guide apparatus using LED apparatuses (light emitting apparatuses). FIG. 4A is a plan schematic diagram of the light guide apparatus, and FIG. 4B is a cross-sectional schematic diagram taken along line A-A of the plan diagram of FIG. 4A, viewed from the arrow direction.

The light guide apparatus 40 shown in FIGS. 4A and 4B has a light guide plate 41 and a plurality of LED apparatuses (light emitting apparatuses) 42 disposed opposite a side end face 41a of the light guide plate 41 to be comprised thereof. The LED apparatus 42 shown in FIGS. 4A and 4B has a configuration obtained by modifying a part of the LED apparatus 20 shown in FIG. 1A, LED apparatus 35 shown in FIG. 1B, LED apparatus 38 shown in FIG. 2, or LED apparatus 20, 35 or 38 (in addition, the configuration where the light scattering agent 27 is added to the first resin layer 24 without adding the quantum dot, and the quantum dot 29 is added to the second resin layer 25 is not changed.)

As shown in FIGS. 4A and 4B, a plurality of LED apparatuses 42 is supported by a case-shaped support body 43, for example. Each of the LED apparatuses 42 is arranged in line on the inner surface of the support body 43, while being spaced at a predetermined interval. The support body 43 is incorporated into the side end face 41a of the light guide plate 41, and each of the LED apparatuses 42 is thereby arranged in a state opposed to the side end face 41a of the light guide plate 41.

As shown in FIG. 4B, a reflecting plate 44 is provided on the backside 41b of the light guide plate 41, and a display section 45 such as a liquid crystal display is disposed on the frontside 41c side of the light guide plate 41. Further, a polarizing plate 46 and the like are disposed between the light guide plate 41 and the display section 45. In FIG. 4B, the display section 45 and polarizing plate 46 shown by dotted lines are not included in components of the light guide apparatus 40, but it is also possible to incorporate the polarizing plate 46 and the like into the light guide apparatus 40 as components. Further, configuration where up to the display section 45 is incorporated into the light guide apparatus 40 is defined as a display apparatus.

The light guide apparatus 40 shown in FIGS. 4A and 4B uses the LED apparatus 42 with the black discoloration occurrence suppressed, and enables light extraction efficiency from the surface (light output surface) 41c of the light guide plate 41 to be effectively improved. Further, in this Embodiment, the light scattering agent is added to the first resin layer constituting the LED apparatus 42 to enable diffused light to be released properly from the entire light emitting surface of the LED apparatus 42, and it is possible to guide the light substantially over the entire light guide plate 41. As a result, it is expected to reduce the manufacturing cost by eliminating a part (for example, eliminating a diffusion plate) of layer configuration conventionally existing between the light guide plate 41 and the display section 45, modifying and the like.

Figure 5A:
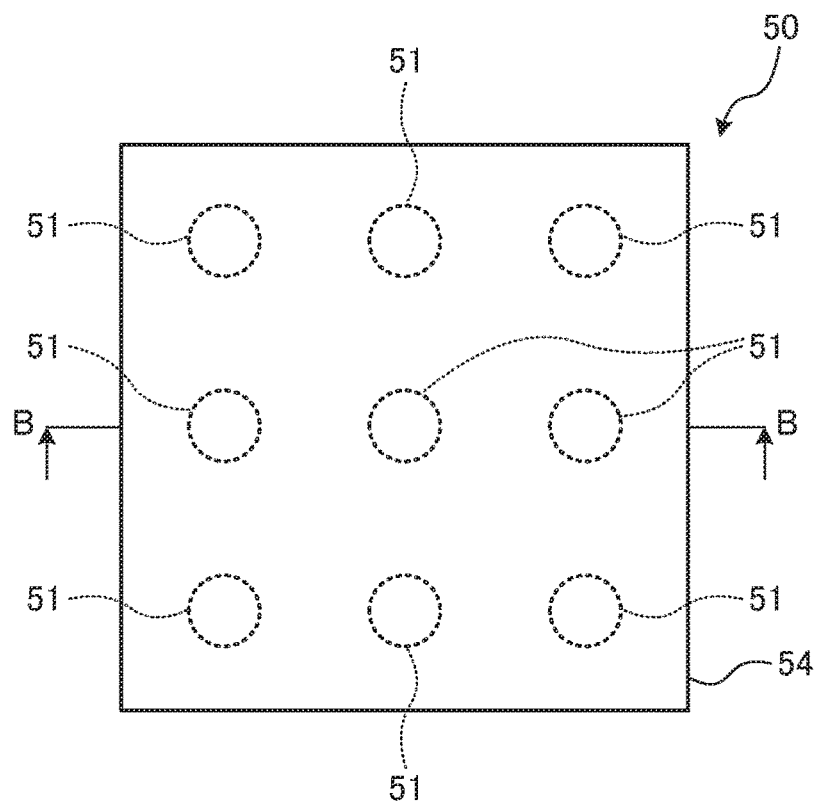
FIGS. 5A and 5B are schematic diagrams of a display apparatus using LED apparatuses (light emitting apparatuses)
Figure 5B:
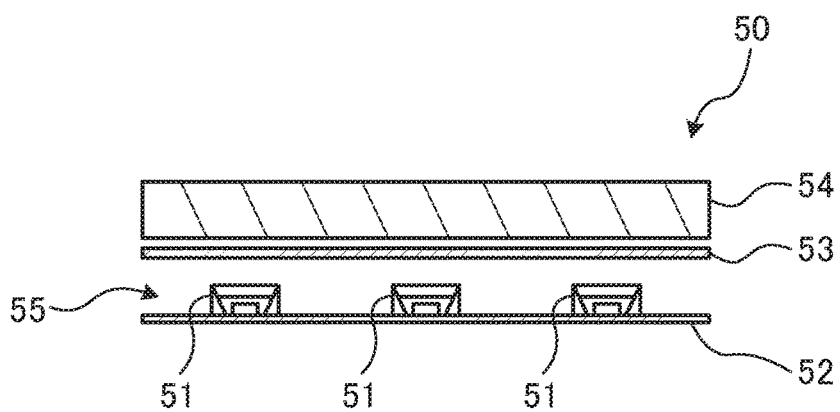

FIGS. 5A and 5B are schematic diagrams of a display apparatus using LED apparatuses (light emitting apparatuses). FIG. 5A is a plan schematic diagram of the display apparatus, and FIG. 5B is a cross-sectional schematic diagram taken along line B-B of the plan diagram of FIG. 5A, viewed from the arrow direction.

As shown in FIGS. 5A and 5B, a display apparatus 50 has a plurality of LED apparatuses 51, and a display section 54 such as a liquid crystal display opposite each of the LED apparatuses 51 to be comprised thereof. Each of the LED apparatuses 51 is disposed on the back side of the display section 54.

The LED apparatus 51 shown in FIGS. 5A and 5B has a configuration obtained by modifying a part of the LED apparatus 20 shown in FIG. 1A, LED apparatus 35 shown in FIG. 1B, LED apparatus 38 shown in FIG. 2, or LED apparatus 20, 35 or 38 (in addition, the configuration where the light scattering agent 27 is added to the first resin layer 24 without adding the quantum dot, and the quantum dot 29 is added to the second resin layer 25 is not changed.)

As shown in FIG. 5B, a plurality of LED apparatuses 51 is supported by a support body 52. Each of the LED apparatuses 51 is arranged while being spaced at a predetermined interval. The LED apparatuses 51 and support body 52 constitute a backlight 55 for the display section 54. The support body 52 is in the shape of a sheet, plate, case or the like, and is particularly not limited in the shape and material.

As shown in FIG. 5B, a polarizing plate 53 and the like exist between the backlight 55 and the display section 54.

The display apparatus 50 shown in FIGS. 5A and 5B uses the LED apparatus 51 with the black discoloration occurrence suppressed, and enables light extraction efficiency of the backlight 55 to be improved. Further, in this Embodiment, the light scattering agent is added to the first resin layer constituting the LED apparatus 51 to enable diffused light to be released properly from the entire light emitting surface of the LED apparatus 51. As a result, it is possible to expect removal of the diffusion plate conventionally existing between the backlight 55 and the display section 45.

Figure 6:
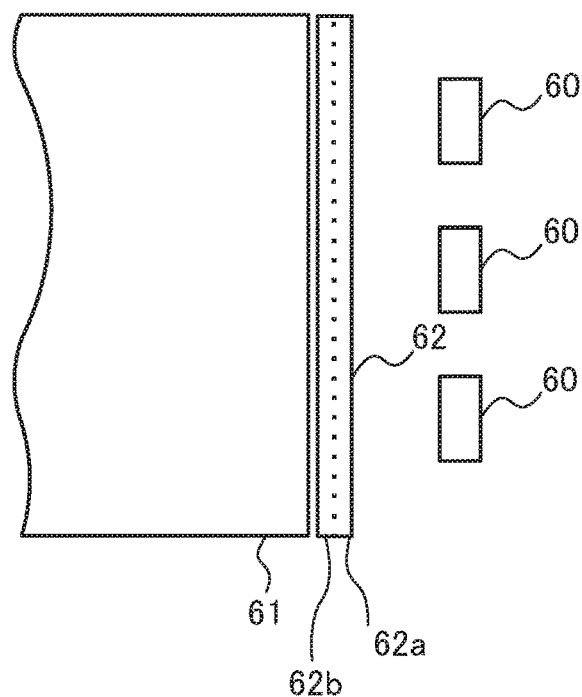
FIG. 6 is a schematic diagram of a resin molded body provided with quantum dots.

FIG. 6 is a schematic diagram of a resin molded body provided with quantum dots. In FIG. 6, a bar-shaped wavelength conversion member 62 exists between light emitting devices 60 such as LEDs and a light guide plate 61. In this Embodiment, a resin including quantum dots is formed in the shape of a bar or rod to constitute the wavelength conversion member 62 shown in FIG. 6. Light emitted from the light emitting device 60 is subjected to wavelength conversion in the wavelength conversion member 62, and the light subjected to wavelength conversion is output to the light guide plate 61. For example, the wavelength conversion member 62 includes each of quantum dots with fluorescent wavelengths of 520 nm (green) and 660 nm (red). Then, a part of blue photons emitted from the light emitting device 60 is converted into green or red by each of quantum dots, and white light is thereby output from the wavelength conversion member 62 to the light guide plate 61.

As shown in FIG. 6, the wavelength conversion member 62 is made two-layer structure. A first layer 62a is formed on the side (light input surface side) close to the light emitting device 60, and a second layer 62b is formed on the side (light output surface side) far from the light emitting device 60. In this Embodiment, it is possible to form the first layer 62a and second layer 62b in two colors. The light scattering agent is included in at least the first layer 62a, and quantum dots are not included in the first layer 62a, and are included in the second layer 62b.

Figure 7:
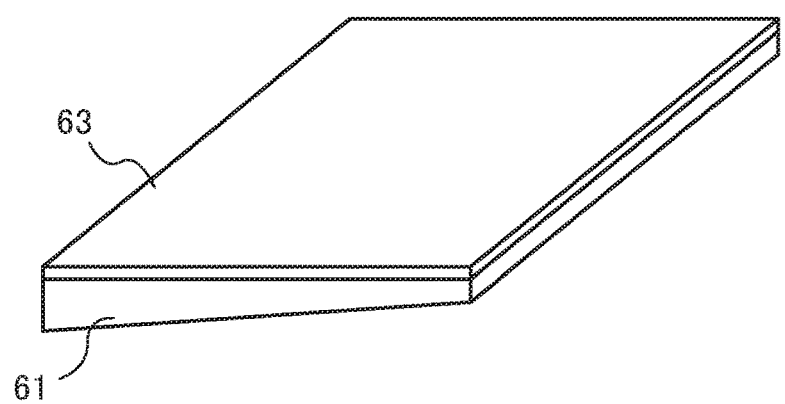
FIG. 7 is a perspective diagram of a resin formed sheet provided with quantum dots.

In FIG. 7, on the light emitting surface of the light guide plate 61 is provided a wavelength conversion sheet 63 formed by using a resin including quantum dots. In this Embodiment, the wavelength conversion sheet 63 may be applied and formed onto the light guide plate 61, or may be beforehand formed in the shape of a sheet to be stacked on the light emitting surface of the light guide plate 61. Further, another film such as a diffusion film may be disposed between the light guide plate 61 and the wavelength conversion sheet 63. The wavelength conversion sheet 63 is made two-layer structure, the light scattering agent is included in the first layer formed on the light input surface side, and the quantum dot is included in the second layer formed on the light output surface side.

Further, it is also possible to form the light guide plate 61 itself by using a resin including quantum dots. Both the light guide plate 61 and the wavelength conversion sheet 63 are capable of including quantum dots that emit green light and quantum dots that emit red light. Furthermore, it is also possible that the light guide plate 61 includes quantum dots that emit green light, and that the wavelength conversion sheet 63 includes quantum dots that emit red light. Alternatively, conversely, it is also possible that the light guide plate 61 includes quantum dots that emit red light, and that the wavelength conversion sheet 63 includes quantum dots that emit green light.

Figure 8A:
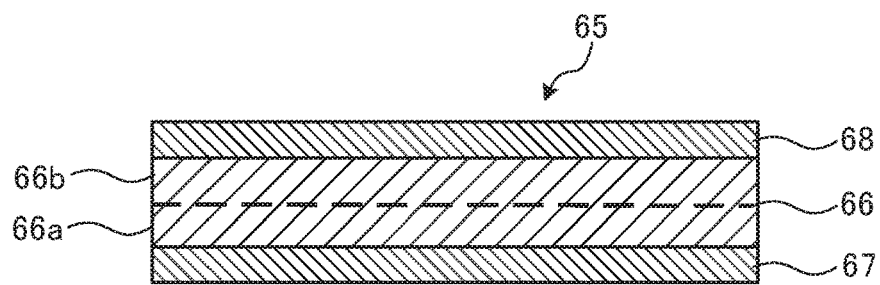
FIG. 8A is a longitudinal sectional diagram of a sheet member provided with quantum dots and FIGS. 8B and 8C are schematic diagrams of application using the sheet member.
Figure 8B:
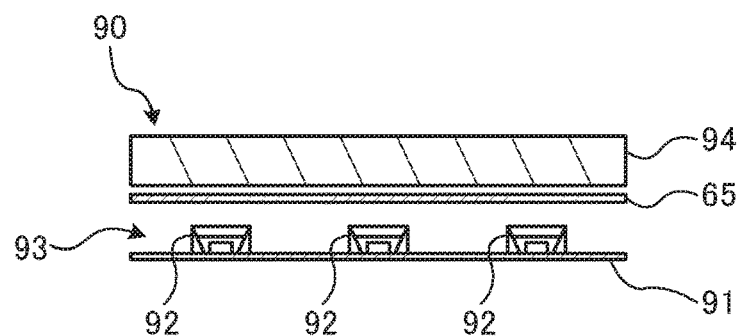
Figure 8C:
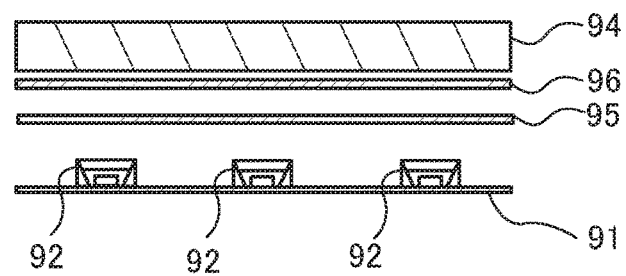

FIG. 8A is a longitudinal sectional diagram of a sheet member provided with quantum dots and FIGS. 8B and 8C are schematic diagrams of application using the sheet member. A sheet member 65 has a quantum dot layer 66 having quantum dots, and barrier layers 67, 68 formed on the opposite sides of the quantum dot layer 66 to be comprised thereof. Generally, the "sheet" is regarded as a configuration where its thickness is thin with respect to the length and width. The presence or absence of flexibility of the sheet member 65 is not required, but it is suitable that the sheet has flexibility. The sheet member 65 may sometimes be called simply a sheet, or may be called a film, film sheet or the like.

As shown in FIG. 8A, the barrier layers 67, 68 are disposed on the opposite sides of the quantum dot layer 66, respectively. An adhesive layer may be included between the quantum dot layer 66 and each of the barrier layers 67, 68, and in this Embodiment, it is possible to form the barrier layers 67, 68 brought into contact with the both surfaces of the quantum dot layer 66. By thus providing the barrier layers 67, 68, the both surfaces of the quantum dot layer 66 are protected, and it is possible to improve environmental resistance (durability).

Each of the barrier layers 67, 68 is formed of a single layer of an organic layer, or laminate structure of an organic layer and inorganic layer. As the organic layer, it is possible to exemplify a PET (polyethylene terephthalate) film. Further, as the inorganic layer, it is possible to exemplify a $SiO_2$ layer. Alternatively, the inorganic layer may be a layer of silicon nitride ($SiN_x$), aluminium oxide ($Al_2O_3$), titanium oxide ($TiO_2$), or silicon oxide ($SiO_2$), or a laminate thereof.

As shown in FIG. 8A, the quantum dot layer 66 is divided into two layers. The surface of the barrier layer 67 on the first layer 66a side constitutes the light input surface, and the barrier layer 68 on the second layer 66b side constitutes the light output surface. Accordingly, the first layer 66a is disposed on the side closer to the light emitting device than the second layer 66b. The light scattering agent is included in at least the first layer 66a, and quantum dots are not included in the first layer 66a, and are included in the second layer 66b.

The sheet member 65 including quantum dots is capable of being incorporated into a backlight apparatus 93 shown in FIG. 8B, for example. In FIG. 8B, the backlight apparatus 93 is comprised by having a plurality of light emitting devices 92 (LEDs) and the sheet member 65 opposed to the light emitting devices 92. As shown in FIG. 8B, each of the light emitting devices 92 is supported on the surface of a support body 91. In FIG. 8B, the backlight apparatus 93 is disposed on the back side of a display section 94 such as a liquid crystal display, thereby constituting a display apparatus 90. In addition, the light emitting device 92 shown in FIG. 8B may be the LED apparatus shown in FIG. 1A, 1B or 10 and FIG. 2.

In addition, although not shown in FIG. 8B, as well as the sheet member 65, a diffusion plate that diffuses light, another sheet and the like may exist between the light emitting devices 92 and the display section 94.

Further, the sheet member 65 is formed of a single sheet, and for example, a plurality of sheet members 65 may be joined to be a predetermined size. Hereinafter, the configuration where a plurality of sheet members 65 is joined by tiling is referred to as a composite sheet member.

In FIG. 8C, components are disposed in the order of light emitting devices 92/composite sheet member 95/diffusion plate 96/display section 94. By this means, even when unevenness of an emitted color caused by diffuse reflection, deterioration of quantum dots by water vapor entering from a joint or the like occurs in the joint of sheet members constituting the composite sheet member 75, it is possible to suitably suppress that color unevenness occurs in display of the display section 94. In other words, the light released from the composite sheet member 95 is diffused by the diffusion plate 96, and then, is input to the display section 94, and it is thereby possible to suppress color unevenness in display in the display section 94.

Figure 9A:
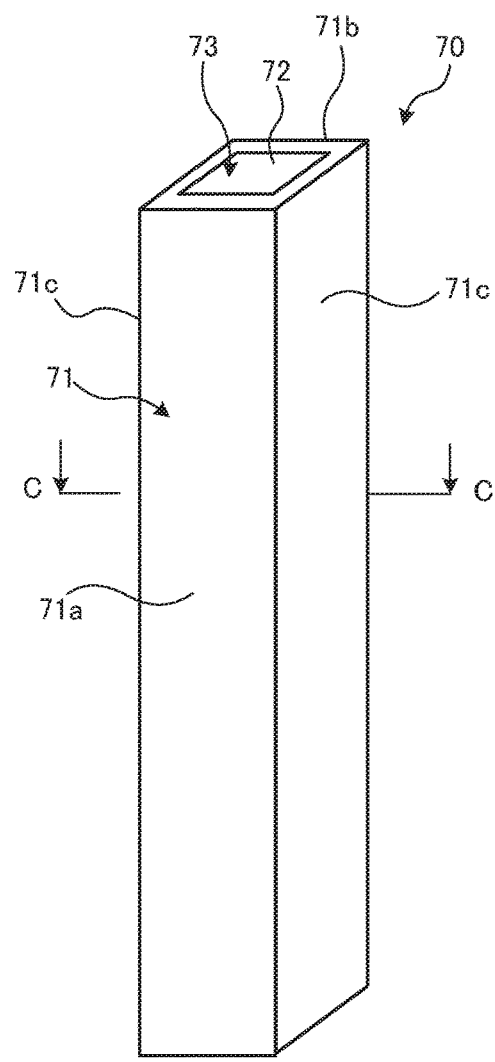
FIG. 9A is a perspective diagram of a wavelength conversion apparatus provided with quantum dots and FIG. 9B is a cross-sectional diagram along arrows C-C.
Figure 9B:
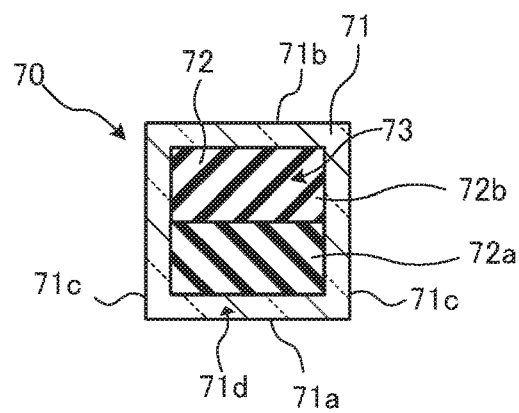

FIG. 9A is a perspective diagram of a wavelength conversion apparatus provided with quantum dots and FIG. 9B is a cross-sectional diagram along arrows C-C. FIG. 9A is the perspective diagram of the wavelength conversion apparatus, and FIG. 9B is the cross-sectional diagram of the wavelength conversion apparatus shown in FIG. 9A taken along line C-C in the plane direction, viewed from the arrow direction.

As shown in FIG. 9A, the wavelength conversion apparatus 70 has a container 71, and a molded body 72 including a wavelength conversion substance to be comprised thereof.

The container 71 is provided with storage space 73 capable of storing the molded body 72 including the wavelength conversion substance to hold. It is preferable that the container 71 is a transparent member. "Transparent" refers to a member generally regarded as being transparent, or a member in which visible light transmittance is about 50% or more.

Horizontal and vertical dimensions of the container 71 range from about several millimeters to several tens of millimeters, and horizontal and vertical dimensions of the storage space 73 range from about several hundreds of micrometers to several millimeters.

As shown in FIGS. 9A and 9B, the container 71 is provided with a light input surface 71a, light output surface 71b, and side surfaces 71c connecting between the light input surface 71a and the light output surface 71b. As shown in FIGS. 9A and 9B, the light input surface 71a and the light output surface 71b are in a position relationship where the surfaces are opposed to each other.

As shown in FIGS. 9A and 9B, in the container 71, the storage space 73 is formed on the inner side of the light input surface 71a, the light output surface 71b and the side surface 71c. In addition, a part of the storage space 73 may reach the light input surface 71a, the light output surface 71b or the side surface 71c.

The container 71 shown in FIGS. 9A and 9B is a container formed of a glass tube, for example, and it is possible to exemplify a glass capillary. In addition, as long as it is possible to form a container with excellent transparency as described above, the container may be made of a resin or the like.

As shown in FIGS. 9A and 9B, in the storage space 73 is disposed in the molded body 72 including the wavelength conversion substance. As shown in FIGS. 9A and 9B, the storage space 73 is open, and it is possible to insert the molded body 72 including the wavelength conversion substance therefrom.

It is possible to insert the molded body 72 including the wavelength conversion substance into the storage space 73 by means such as injection and adhesion. In the case of injection, the molded body 72 including the wavelength conversion substance is formed in the completely same size as that of the storage space 73, or is formed to be slightly larger than the storage space 73, and by inserting the molded body 72 including the wavelength conversion substance into the storage space 73, while applying pressure, it is possible to suppress the fact that gaps occur not only inside the molded body 72 including the wavelength conversion substance, but also between the molded body 72 including the wavelength conversion substance and the container 71.

Further, in the case of bonding the molded body 72 including the wavelength conversion substance to the inside of the storage space 73 to fix, the molded body 72 including the wavelength conversion substance is formed to be smaller than the storage space 73, and in a state in which an adhesive layer is applied to the side surfaces of the molded body 72 including the wavelength conversion substance, is inserted into the storage space 73. At this point, the cross-sectional area of the molded body 72 may be slightly smaller than the cross-sectional area of the storage space 73. By this means, the molded body 72 including the wavelength conversion substance and the container 71 are brought into intimate contact with each other via the adhesive layer, and it is possible to suppress the fact that gaps are formed between the molded body 72 including the wavelength conversion substance and the container 71. As the adhesive layer, it is possible to use the same resin as the molded body 72, or a resin that the basic structure is common to the molded body 72. Further, as the adhesive layer, a transparent adhesive may be used.

As shown in FIG. 9B, the molded body 72 is formed of two-layer structure, and is comprised of a first layer 72a on the light input surface 71a side and a second layer 72b on the light output surface 71b side. In this Embodiment, it is possible to form the first layer 72a and second layer 72b in two colors. The light scattering agent is included in at least the first layer 72a, and quantum dots are not included in the first layer 72a, and are included in the second layer 72b. Further, the light scattering agent may be included inside a container front end portion 71d between the light input surface 71a and the molded body 72. In such a case, the molded body 72 may be made a configuration where quantum dots are dispersed entirely. In other words, the container front end portion 71d constitutes the first layer, and the molded body 72 constitutes the second layer.

Further, it is preferable that a refractive index of the molded body 72 including the wavelength conversion substance is smaller than a refractive index of the container 71. By this means, a part of the light entering into the molded body 72 including the wavelength conversion substance is totally reflected by side wall portions of the container 71 facing the storage space 73. This is because an incident angle on the medium side with a low refractive index is larger than an incident angle on the medium side with a high refractive index. By this means, it is possible to decrease an amount of light leaking from the side to the outside of the container 71, and it is thereby possible to enhance color conversion efficiency and light emission intensity.

A light emitting device is disposed on the light input surface 71a side of the wavelength conversion member 70 shown in FIGS. 9A and 9B. Further, the light guide plate 61 shown in FIG. 6 and the like are disposed on the light output surface 71b side of the wavelength conversion member 70. In addition, FIGS. 9A and 9B illustrate the molded body 72, and a quantum dot layer may be formed by injecting a resin composition including quantum dots.

Figure 10:
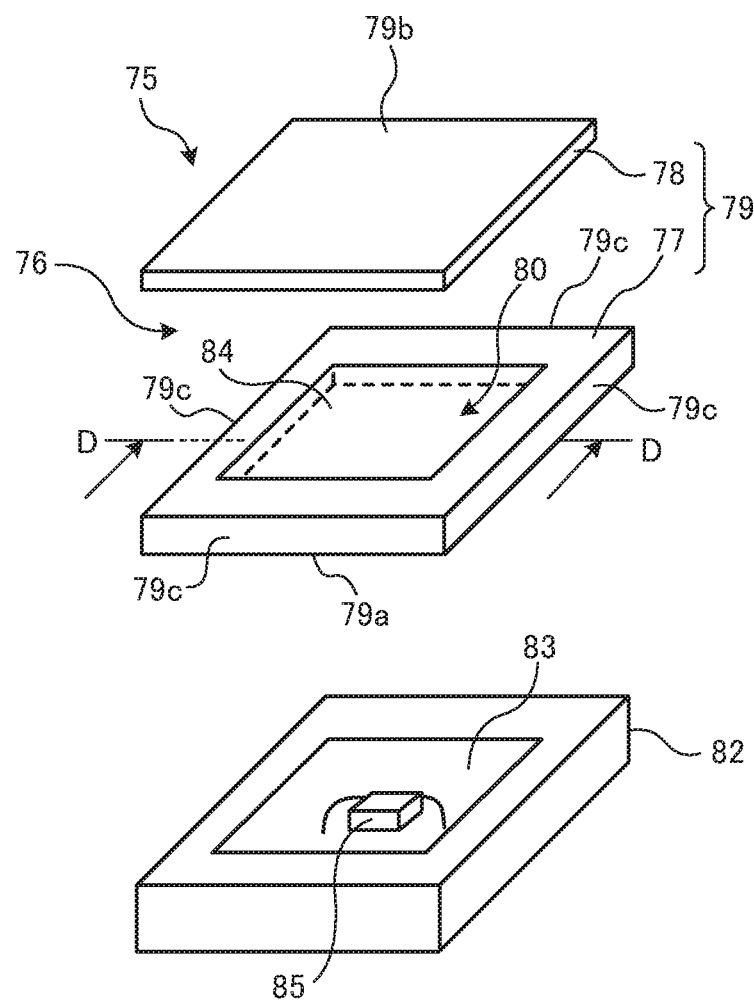
FIG. 10 is a perspective diagram of a light emitting apparatus comprised by having a wavelength conversion member provided with quantum dots.
Figure 11:
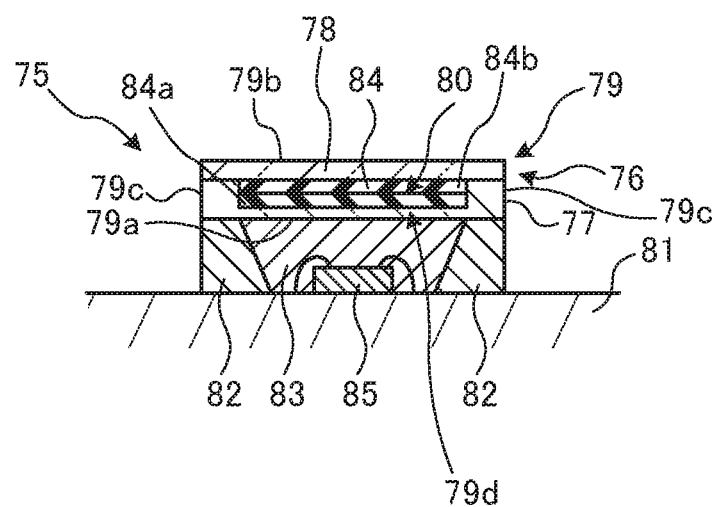
FIG. 11 is a longitudinal sectional diagram taken along line D-D in the height direction viewed from the arrow direction in a state in which each component of the light emitting device shown in FIG. 10 is combined.

FIG. 10 is a perspective diagram of a light emitting device having a wavelength conversion member provided with quantum dots to be comprised thereof. FIG. 11 is a long to final sectional diagram taken along line D-D in the height direction viewed from the arrow direction in a state in which each component of the light emitting device shown in FIG. 10 is combined.

The light emitting device 75 shown in FIGS. 10 and 11 has a wavelength conversion member 76 and LED chip (light emitting section) 85 to be comprised thereof. The wavelength conversion member 76 is provided with a container 79 comprised of a plurality of pieces including a container main body 77 and a lid body 78. Further, as shown in FIG. 10, in the center portion of the container main body 77 is formed storage space 80 with the bottom. In the storage space 80 is provided a wavelength conversion layer 84 including quantum dots. The wavelength conversion layer 84 may be a molded body, or may be filled inside the storage space 80 by potting processing and the like. Then, the container main body 77 and lid body 78 are joined via an adhesive layer.

A light input surface 79a is a lower surface of the container 79 of the wavelength conversion member 76 shown in FIGS. 10 and 11. A light output surface 79b is an upper surface opposite the light input surface 79a. The storage space 80 is formed in a position on the inner side with respect to each side surface 79c provided in the container 79 of the wavelength conversion member 76 shown in FIGS. 10 and 11.

As shown in FIG. 11, the LED chip 85 is connected to a printed wiring board 81, and as shown in FIGS. 10 and 11, the circumference of the LED chip 85 is enclosed with a frame body 82. Then, the inside of the frame body 82 is sealed with a resin layer 83.

As shown in FIG. 11, the wavelength conversion member 76 is joined to the upper surface of the frame body 82 via an adhesive layer not shown, and the light emitting device 75 such as an LED is thereby comprised.

As shown in FIG. 11, the wavelength conversion layer 84 is formed of two-layer structure, and is comprised of a first layer 84a on the light input surface 79a side and a second layer 84b on the light output surface 79b side. In this Embodiment, it is possible to form the first layer 84a and second layer 84b in two colors. The light scattering agent is included in at least the first layer 84a, and quantum dots are not included in the first layer 84a, and are included in the second layer 84b. Further, the light scattering agent may be included inside a container front end portion 79d among the resin layer 83, the light input surface 79a and the wavelength conversion layer 84. In such a case, the wavelength conversion layer 84 may be made a configuration where quantum dots are dispersed entirely. In other words, the container front end portion 79d and/or the resin layer 83 constitutes the first layer, and the wavelength conversion layer 84 constitutes the second layer.

Further, it is possible to apply the LED apparatus (light emitting apparatus) of the present invention to a lighting apparatus, light source apparatus, light diffusion apparatus, light reflecting apparatus and the like, as well as the light guide apparatus and display apparatus as shown in the above-mentioned description.

Example

The present invention will specifically be described below, using Examples performed to clarify the effects of the invention and Comparative Examples. In addition, the invention is not limited by the following Examples at all.

[Quantum Dot]

Red light emitting quantum dots (QY value; 83%) and green light emitting quantum dots (QY value; 80%, 81%) with core/shell structure
[Dispersion Resin for Quantum Dots]
Silicone resin or epoxy resin
[Light Scattering Agent]
Silica ($SiO_2$)

In experiments, about 1 mass % to 2 mass % of quantum dots, and the light scattering agent in a range of 25.5 mass % to 10 mass % were mixed in the resin. In addition, "Abs10" shown in FIGS. 12 and 13 represents a mixture obtained by mixing about 1 mass % to 2 mass % of quantum dots, and "Abs15" represents a mixture obtained by mixing about 2.5 mass % of quantum dots.

In the experiments, the resin including the quantum dots and light scattering agent was sealed in a glass capillary with internal dimensions of 0.5 mm×0.5 mm square, and the capillary was bonded to the bottom of a light guide plate. A configuration of the resin layer corresponded to FIG. 1C. At this point, as a light source, an LED (drive 40 mA) with a wavelength of 450 nm was lighted. Then, measured were the relationship (FIG. 12) between a wavelength and light intensity with respect to the content of the light scattering agent, the relationship (FIG. 13) between the content of the light scattering agent and illuminance, and the relationship (FIG. 14) between the x coordinate and the y coordinate of a chromaticity diagram with respect to the content of the light scattering agent.

Figure 12:
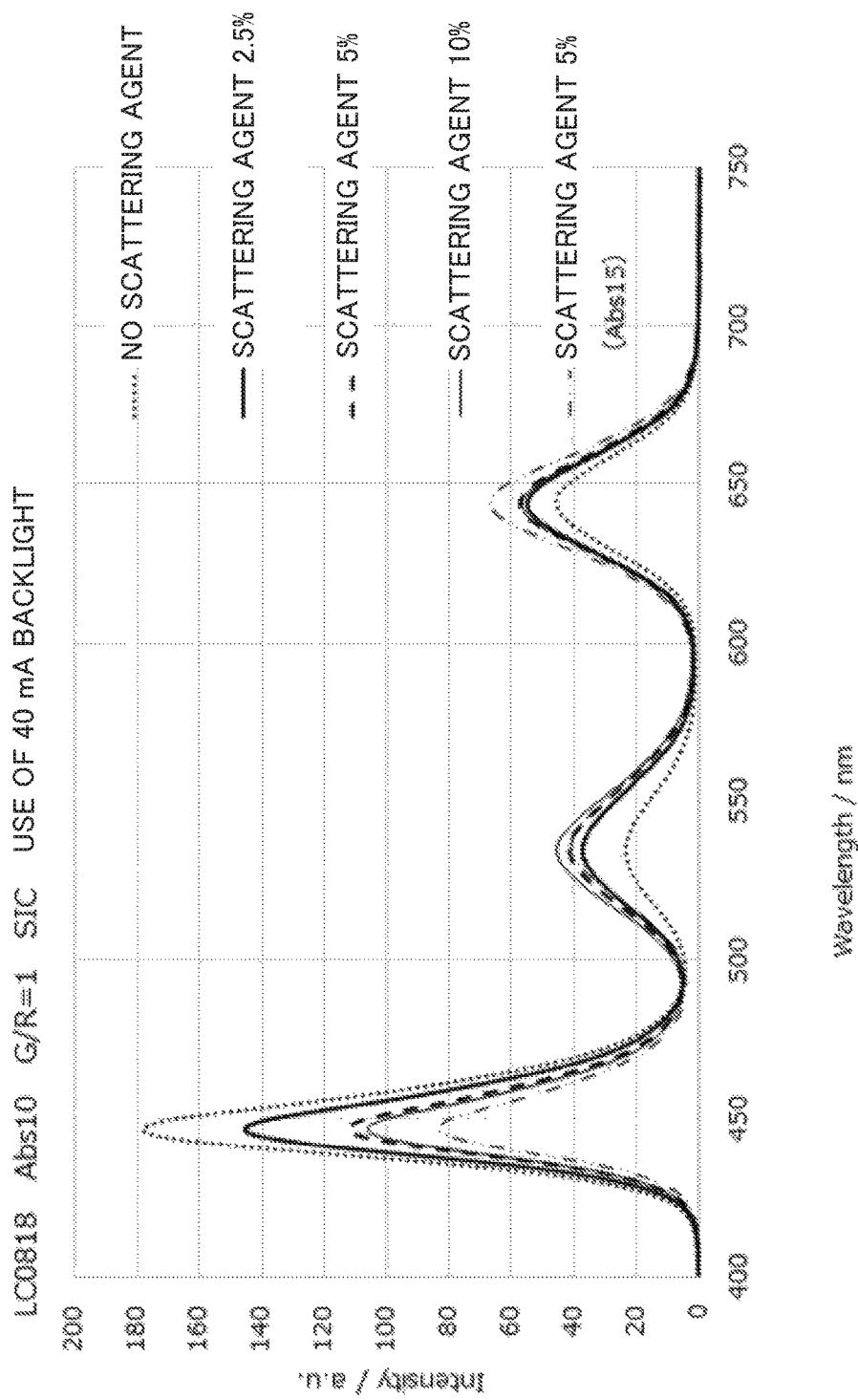
FIG. 12 is a graph illustrating the relationship between a wavelength and light intensity with respect to the content of a light scattering agent.
Figure 14:
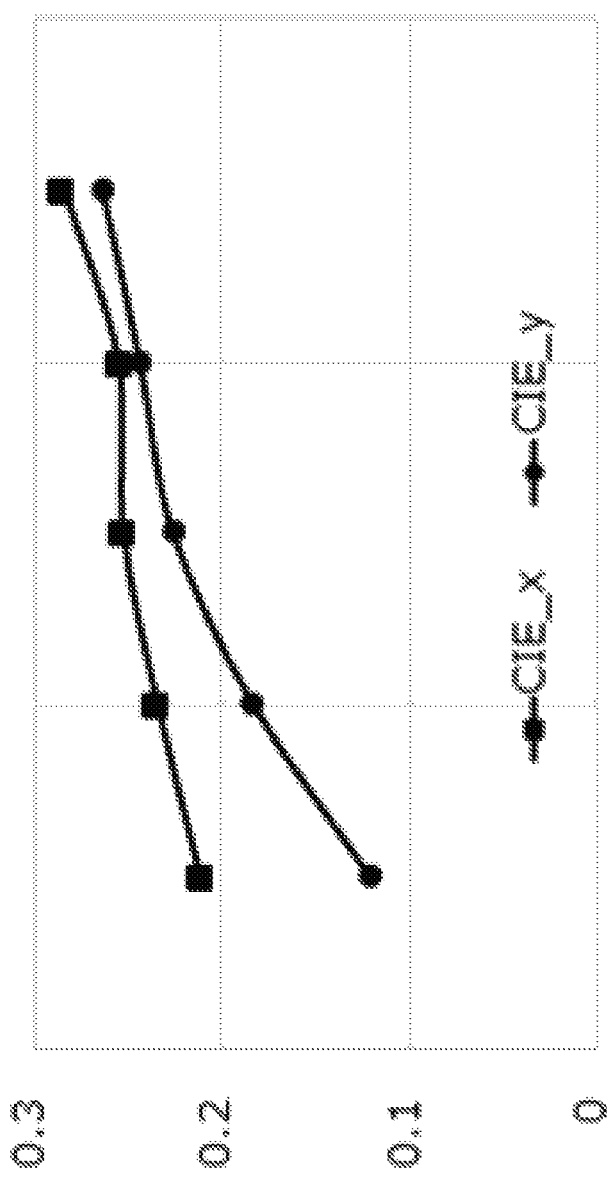
FIG. 14 is a graph illustrating the relationship between the x coordinate and the y coordinate of a chromaticity diagram with respect to the content of the light scattering agent.

As shown in FIG. 12, in the case without the light scattering agent, a large peak was seen at a wavelength of about 450 nm (blue), and by adding the light scattering agent, the peak (blue) of 450 nm was decreased. In the x coordinate and y coordinate of the chromaticity diagram shown in FIG. 14, the leftmost measurement point was of no scattering agent, the measurement point to its right was of 2.5% of the scattering agent, the measurement point to its right was of 5% of the scattering agent, the measurement point to its right was of 10% of the scattering agent, and the rightmost measurement point was of 5% of the scattering agent (Abs15). As shown in FIG. 14, by addition of the light scattering agent, both the x coordinate and y coordinate approached 0.30, and it was possible to obtain light of white or near white.

Figure 13:
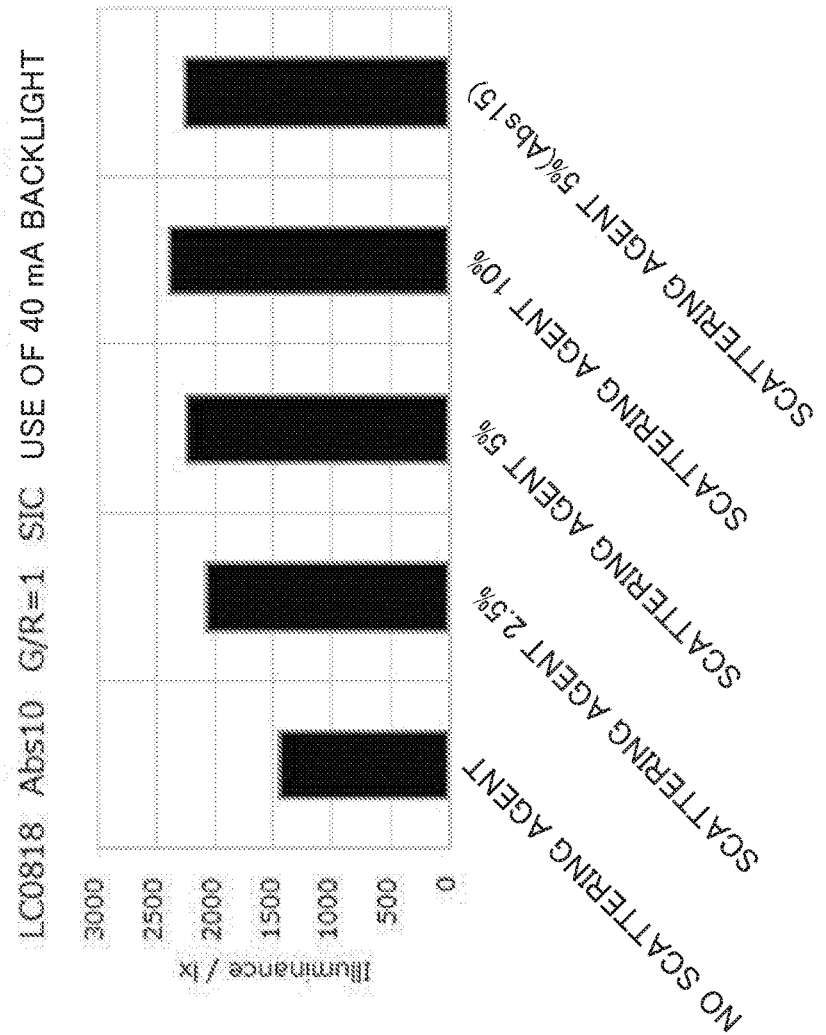
FIG. 13 is a graph illustrating the relationship between the content of the light scattering agent and illuminance.

Further, as shown in FIG. 13, it was understood that the illuminance is higher by adding the light scattering agent than without adding. Furthermore, as shown in FIG. 13, in two Examples of adding 5% of the light scattering agent, in one of the Examples an amount of quantum dots was about 1 to 2 mass %, in the other one (Abs15) the amount was about 2.5 mass %, and the quantum dot amounts were different, while the illuminance was almost the same.

By the above-mentioned experiments, it was understood that by including the light scattering agent in the range of 2.5 mass % to 10 mass % with respect to the resin, it is possible to obtain excellent white light emission and obtain high illuminance.

INDUSTRIAL APPLICABILITY

In the present invention, it is possible to manufacture the LED apparatus and the like without black discoloration occurring in the fluorescent layer positioned immediately above the LED chip. As the light emitting device, as well as an LED, it is possible to adopt organic EL and the like. In the invention, by varying materials of the quantum dot used in the resin layer, it is possible to convert a wavelength of color in the resin layer including the quantum dot into various wavelengths, and it is possible to manufacture the light emitting apparatus and the like which have a wide variety of fluorescent colors without black discoloration occurring and have long apparatus life.

The present application is based on Japanese Patent Application No. 2014-079563 filed on Apr. 8, 2014, entire content of which is expressly incorporated by reference herein.

The invention claimed is:

1. A wavelength conversion member having quantum dots, the wavelength conversion member comprising:
   a first layer disposed on a side of the wavelength conversion member that is provided closest to a light emitting device or on a light input surface side;
   a second layer disposed on a side of the wavelength conversion member that is provided farthest from the light emitting device or on a light output surface side; and
   a light scattering agent included in at least the first layer,
   wherein the quantum dots are not included in the first layer and are included in the second layer,
   wherein the first layer comprises a resin having a thermal conductivity that is different from a thermal conductivity of the second layer.

2. The wavelength conversion member according to claim 1, wherein the light scattering agent included in the first layer comprises an amount from 0.2 volume % to 20 volume %.

3. The wavelength conversion member according to claim 1, further comprising a fluorescent substance.

4. A wavelength conversion member having quantum dots, the wavelength conversion member comprising:
   a resin including a light scattering agent and the quantum dots,
   wherein the light scattering agent is in a range of 2.5 mass % to 10 mass % with respect to the resin,
   wherein the quantum dots are within a range of 1 mass % through 2.5 mass %, and
   wherein the light scattering agent comprises AlN or BN.

5. The wavelength conversion member according to claim 1, wherein the wavelength conversion member comprises a molded body.

6. A wavelength conversion apparatus comprising:
   a container provided with storage space; and
   the wavelength conversion member according to claim 1 disposed inside the storage space.

7. A sheet member made by forming the wavelength conversion member according to claim 1 in the shape of a sheet.

8. A light emitting apparatus comprising:
   the wavelength conversion member according to claim 1, and
   a light emitting device,
   wherein the wavelength conversion member comprises a resin layer covering a light emitting side of the light emitting device,
   wherein the first layer comprises a first resin layer on a side of the wavelength conversion member that is provided closest to the light emitting device, and
   wherein the second layer comprises a second resin layer on a side of the wavelength conversion member that is provided farthest from the light emitting device.

9. A light guide apparatus comprising:
   the wavelength conversion member according to claim 1; and
   a light guide plate.

10. A light guide apparatus, wherein a plurality of light emitting apparatuses according to claim 8 is disposed opposite a surface constituting the light guide plate.

11. A display apparatus comprising:
   a display; and
   the wavelength conversion member according to claim 1 disposed on a back side of the display.

12. The wavelength conversion member according to claim 1, wherein the second layer comprises a resin having greater quantum-dot dispersion characteristics than quantum-dot dispersion characteristics of the first layer.

13. A wavelength conversion member having quantum dots, the wavelength conversion member comprising:
   a first layer disposed on a side of the wavelength conversion member that is provided closest to a light emitting device or on a light input surface side;
   a second layer disposed on a side of the wavelength conversion member that is provided farthest from the light emitting device or on a light output surface side; and
   a fluorescent substance included in at least the first layer,
   wherein the quantum dots are not included in the first layer and are included in the second layer,
   wherein the first layer comprises a resin having a thermal conductivity that is different from a thermal conductivity of the second layer, and
   wherein the second layer comprises a resin having greater quantum-dot dispersion characteristics than quantum-dot dispersion characteristics of the first layer.

* * * * *